United States Patent
Hönigschmid et al.

(10) Patent No.: US 6,255,855 B1
(45) Date of Patent: Jul. 3, 2001

(54) INTEGRATED CIRCUIT HAVING A DECODER

(75) Inventors: Heinz Hönigschmid, Pöcking; Georg Braun; Zoltan Manyoki, both of München; Thomas Röhr, Aschheim; Thomas Böhm, Zorneding, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/470,310

(22) Filed: Dec. 22, 1999

(30) Foreign Application Priority Data

Dec. 22, 1998 (DE) .............................. 198 59 516

(51) Int. Cl.⁷ ...................... H03K 19/084; H03K 19/23; G11C 8/10
(52) U.S. Cl. ...................... 326/106; 326/35; 365/230.06
(58) Field of Search .................... 326/106–108, 326/104–105, 11, 35, 36; 365/230.06

(56) References Cited

U.S. PATENT DOCUMENTS

| | | | |
|---|---|---|---|
| 5,039,883 | * 8/1991 | On ............................... | 326/50 |
| 5,274,278 | 12/1993 | Bauer et al. ........................ | 326/106 |
| 5,323,357 | * 6/1994 | Kaneko .............................. | 365/230 |
| 5,517,138 | * 5/1996 | Baltar et al. ...................... | 326/105 |

FOREIGN PATENT DOCUMENTS

| | | | |
|---|---|---|---|
| 2 065 404 | 6/1981 | (GB) . | |
| 404227323 | * 8/1992 | (JP) ...................................... | 326/106 |

\* cited by examiner

Primary Examiner—Patrick Wamsley
Assistant Examiner—James H Cho
(74) Attorney, Agent, or Firm—Herbert L. Lerner; Laurence A. Greenberg; Werner H. Stemer

(57) ABSTRACT

An integrated circuit includes a decoder having an output terminal and five input terminals. The decoder has three operating states including a first operating state for generating a first potential at the output terminal, a second operating state for generating a second potential at the output terminal, and a third operating state for generating a third potential at the output terminal. The second potential lies between the first potential and the third potential.

11 Claims, 4 Drawing Sheets

| 1 | 2 | 3 | 4 | 5 | OUT | |
|---|---|---|---|---|-----|---|
| 4V | 0V | 0V | 3V | -2V | 4V | |
| 0V | -2V | 0V | 3V | 3V | -2V | V=3V |
| 0V | 0V | 0V | 3V | 3V | 0V | |
| 4V/0V | -2V/0V | 4V | -2V | -2V/3V | 0V | |

INTEGRATED CIRCUIT HAVING A DECODER

BACKGROUND OF THE INVENTION

1. Field of the Invention

The invention relates to an integrated circuit having a decoder for generating an output signal with any one of three different potentials at an output terminal.

2. Summary of the Invention

It is accordingly an object of the invention to provide an integrated circuit having a decoder that generates an output signal with three different potentials as a function of input signals.

With the foregoing and other objects in view there is provided, in accordance with the invention, an integrated circuit that includes a decoder having an output terminal, a first terminal, a second terminal, a third terminal, a fourth terminal, and a fifth terminal. The decoder has three operating states including a first operating state for generating a first potential at the output terminal, a second operating state for generating a second potential at the output terminal, and a third operating state for generating a third potential at the output terminal. The second potential lies between the first potential and the third potential. The decoder also includes a first transistor being of a first conductivity type, having a control terminal connected to the third terminal of the decoder and having a drain-to-source path. The decoder includes a second transistor being of a second conductivity type, having a control terminal connected to the fourth terminal of the decoder and having a drain-to-source path. The decoder includes a third transistor being of the second conductivity type, having a control terminal connected to the fifth terminal of the decoder. The decoder includes a fourth transistor having a control terminal connected to the fourth terminal of the decoder and having a drain-to-source path for connecting the output terminal of the decoder to the second potential. The decoder includes a series circuit connected between the first terminal of the decoder and the second terminal of the decoder. The series circuit includes the first transistor, the second transistor, the third transistor, and a node connected to the output terminal of the decoder and between the first transistor and the second transistor. The integrated circuit, with its first decoder, enables the generation of three different potentials as a function of signals present at the five terminals of the decoder.

In accordance with another feature of the invention, the decoder has a fifth transistor of the second conduction type, which connects the output terminal to the fourth transistor. Consequently, the output terminal is connected to the second potential through a series circuit formed by the fifth and fourth transistors. A control terminal of the fifth transistor is connected to a fixed potential lying between the second and the third potential. This provides the advantage that the bulk terminal of the fourth transistor can be connected to the fixed potential even when the third potential is present at the output terminal of the decoder, since the fourth transistor is not connected directly to the output terminal. The fourth transistor is connected to the output terminal through the fifth transistor. Consequently, the magnitude of the gate-bulk voltage and of the gate-drain voltage of the fourth transistor is limited, as a result of which the gate oxide of the fourth transistor is exposed to relatively low loading. Therefore, the lifetime of the fourth transistor is longer than if the fifth transistor were not present.

In accordance with an added feature of the invention, the integrated circuit has a control circuit that is connected to the five terminals of the decoder. The control circuit has a plurality of operating states in which it generates potentials at the five terminals of the decoder. The decoder generates one of the three different potentials at the output terminal, as a function of the potentials at the five terminals of the decoder.

In accordance with an additional feature of the invention, the control circuit has an inverter configured between the third and the fourth terminal. In this case, the third terminal may be the input and the fourth terminal may be the output of the inverter, or vice versa. Consequently, the control circuit enables the potential at one of these two terminals to be obtained from the potential at the other one of the terminals in a simple manner. It is also possible for the inverter to be a level converter, with the result that level conversion takes place in addition to the inversion.

In accordance with a further feature of the invention, as an alternative to or in addition to the inverter, the control circuit has another inverter configured between the first and the fifth terminal. The first or the fifth terminal may be the input of the second inverter, and the other one of the first and fifth terminals may be the output. This inverter may also have a level converter.

In accordance with an another added feature of the invention, the integrated circuit has another decoder constructed like the decoder. The two decoders may advantageously form a first decoder group, in which the third and the fourth terminals of the decoders are connected to one another. This enables joint driving of the decoders of the first decoder group through the interconnected third and fourth terminals. The potentials at the first, second and fifth terminals of the two decoders are controlled independently of one another.

In accordance with a concomitant feature of the invention, the integrated circuit has a second decoder group constructed like the first decoder group. The first, the second and the fifth terminals of corresponding decoders of the two decoder groups are connected to one another. The third and fourth terminals of each decoder within a respective decoder group are connected to one another. The overall result being that a configuration is produced which can be driven with comparatively little complexity.

Other features which are considered as characteristic for the invention are set forth in the appended claims.

Although the invention is illustrated and described herein as embodied in an integrated circuit having a decoder, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
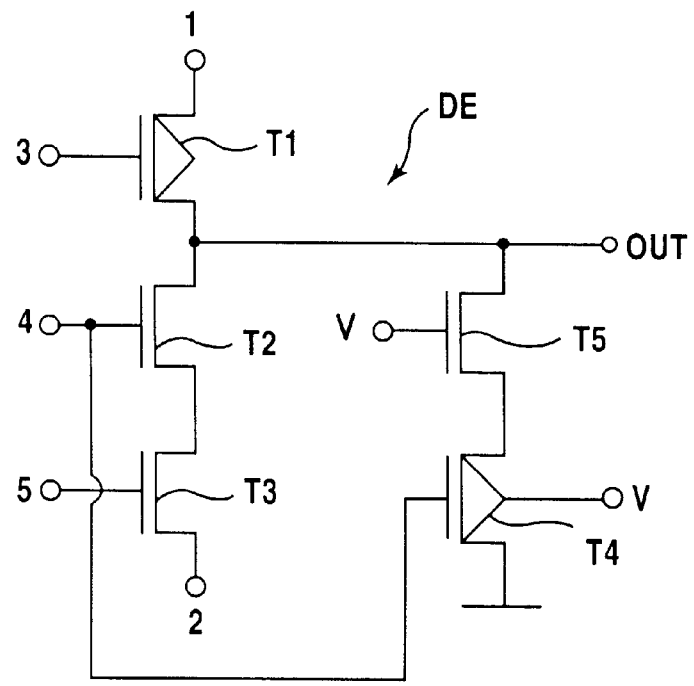
FIG. 1 shows a first exemplary embodiment of a decoder for implementation in an integrated circuit.

Referring now to the figures in detail and first, particularly, to FIG. 1 thereof, there is shown a decoder DE for implementation in an integrated circuit. The decoder DE has five terminals 1, 2, 3, 4, and 5 for applying control signals, and an output terminal OUT. The first terminal 1 is connected to the second terminal 2 through a series connection of a first transistor T1 of the p-channel type, a second transistor T2 of the n-channel type, and a third transistor T3 of the n-channel type. The drain of the first transistor T1 and the drain of the second T2 transistor are connected to the output terminal OUT. The output terminal OUT is additionally connected to ground through a fifth transistor T5 of the n-channel type and a fourth transistor T4 of the p-channel type. A control terminal of the fifth transistor T5 is connected to a fixed potential V. The third terminal 3 is connected to a control terminal of the first transistor T1, while the fourth terminal 4 is connected to a control terminal of the second transistor T2 and to a control terminal of the fourth transistor T4. The fifth terminal 5 is connected to a control terminal of the third transistor T3. A bulk terminal of the fourth transistor T4 is connected to the fixed potential V.

Figures 3, 4:
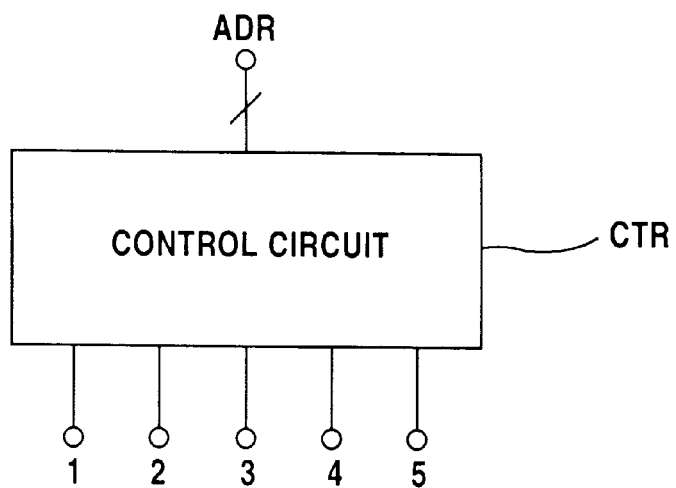
FIG. 3 shows a control circuit for driving one of the decoders shown FIG. 1 or 2, and that can be implemented in an integrated circuit.
FIG. 4 shows a table illustrating the dependence of the output potential from the decoder shown in FIG. 1 on the potentials at its five terminals.

FIG. 3 shows a control circuit CTR of the integrated circuit, that has address inputs ADR for applying addresses to be decoded by the decoder DE in FIG. 1. The control circuit CTR additionally has five outputs respectively connected to one of the five terminals 1, 2, 3, 4, and 5 of the decoder DE shown in FIG. 1. The control circuit CTR generates pre-decoded signals at the five terminals 1, 2, 3, 4, and 5 as a function of the address present at its address inputs ADR. The decoder DE shown in FIG. 1 then further decodes these pre-decoded signals and generates one of three different potentials at its output terminal OUT. In the present case, the decoder DE shown in FIG. 1 generates −2V, 0V (ground), and 4V at the output terminal OUT. The fixed potential V is equal to 3V in this exemplary embodiment.

The precise structure of the control circuit CTR is not essential to the invention and it is not, therefore, discussed any further. All that is important is that the control circuit CTR is able to generate the potentials (described below) at the five terminals 1, 2, 3, 4, and 5 of the decoder DE.

FIG. 4 shows a table whose first five columns show the control potentials, generated by the control circuit CTR, at the terminals 1, 2, 3, 4, and 5. The fifth column shows the output potential at the output terminal OUT of the decoder DE shown in FIG. 1. The method of operation of the decoder DE shown in FIG. 1 is explained below with reference to FIG. 4. For generating 4V at the output terminal OUT of the decoder DE, the control circuit CTR generates 4V at the first terminal 1, 0V at the second terminal 2 and at the third terminal 3, 3V at the fourth terminal 4, and −2V at the fifth terminal 5. For the generating −2V at the output terminal OUT of the decoder DE, the control circuit CTR generates 0V at the first terminal 1 and at the third terminal 3, −2V at the second terminal 2, and 3V at the fourth terminal 4 and at the fifth terminal 5. For generating 0V at the output terminal OUT of the decoder DE, the control circuit CTR can generate 0V at each of the first three terminals 1, 2, 3, and 3V at the fourth terminal 4 and at the fifth terminal 5. Alternatively, for generating 0V at the output terminal OUT of the decoder DE, the control circuit CTR can generate either 4V or 0V at the first terminal 1, either −2V or 0V at the second terminal 2, 4V at the third terminal 3, −2V at the fourth terminal 4, and either −2V or 3V at the fifth terminal 5.

The decoder shown in FIG. 1 thus makes it possible to generate the three different potentials −2V, 0V and 4V at the output terminal OUT without causing the gate-bulk voltages, the gate-source voltages, or the gate-drain voltages of the transistors T1, T2, T3, T4, and T5 of the decoder DE to become very large. In the present embodiment, the largest such voltage is 5V. The magnitude limited gate-bulk, gate-source and/or gate-drain voltages of the transistors T1 to T5 in the decoder DE shown in FIG. 1 mean that the gate oxides of the transistors T1–T5 are loaded to a relatively small extent. This enables these transistors T1–T5 to have a relatively long lifetime even when constructed with small dimensions.

Figure 2:
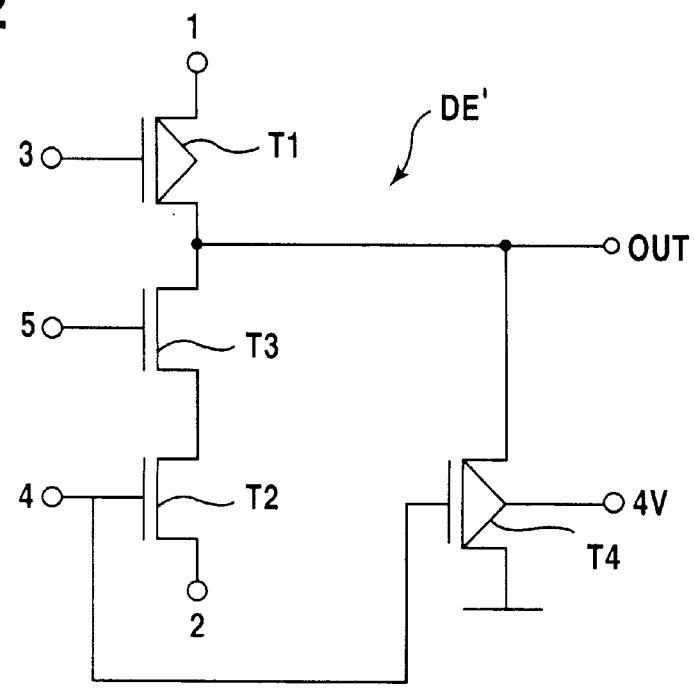
FIG. 2 shows a second exemplary embodiment of the decoder.

FIG. 2 shows another exemplary embodiment of a decoder DE', in which the position of the second T2 and third T3 transistors are interchanged with respect to the embodiment shown in FIG. 1, and in which the fourth transistor T4 is connected directly to the output terminal OUT. The substrate or bulk terminal of the fourth transistor T4 is connected to 4V. This decoder DE' is likewise suitable for generating three different output potentials. However, the potential at the fourth terminal 4 must in this case be chosen to be equal to 4V in order to completely turn off the fourth transistor T4 when 4V is generated at the output terminal OUT. If −2V is then present at the second terminal 2, a gate-source voltage and a gate-bulk voltage of 6V are produced at the second transistor T2, which does not occur in the case of the exemplary embodiment of the decoder DE shown in FIG. 1. As a result, the gate oxide of the second transistor T2 is loaded to a greater extent. In a modification of the exemplary embodiment of the decoder DE' shown in FIG. 2, the decoder DE' may also have the fifth transistor T5, shown in FIG. 1, connected between the fourth transistor T4 and the output terminal OUT. The above-described problem at the fourth transistor T4 is then avoided.

Figure 5:
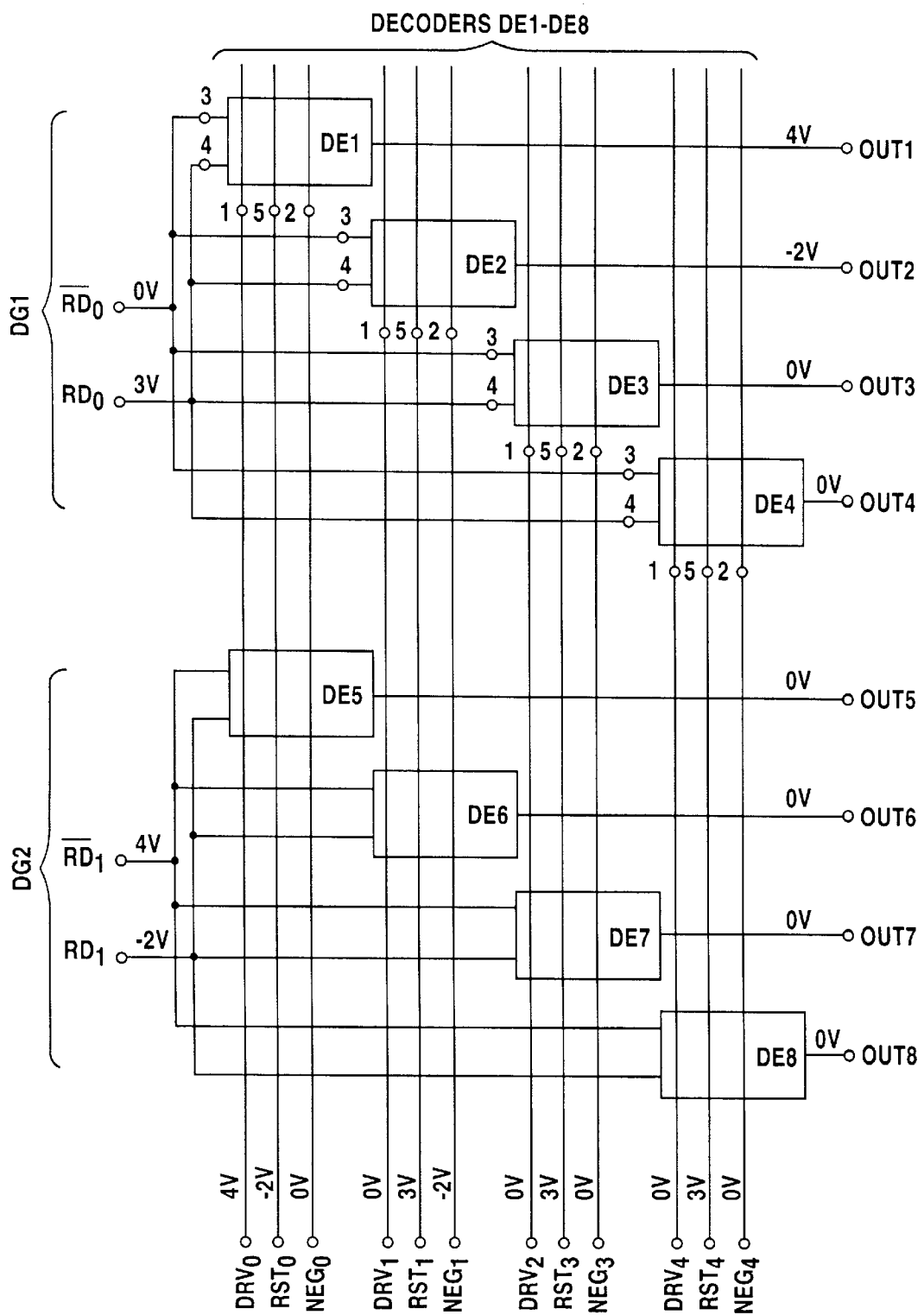
FIG. 5 shows an exemplary embodiment of an integrated circuit in which a plurality of decoders are combined to form two decoder groups.

FIG. 5 shows an exemplary embodiment of the integrated circuit according to the invention that contains eight decoders DE1–DE8 that are constructed in accordance the decoder DE shown in FIG. 1. The first four decoders DE1–DE4 form a first decoder group DG1 and the last four decoders DE5–DE8 form a second decoder group DG2 of the integrated circuit. In the first decoder group DG1, the third terminal 3 of each one of the decoders DE1–DE4 are connected together and the fourth terminal 4 of each one of the decoders DE1–DE4 are connected together. Similarly, in the second decoder group DG2, the third terminal 3 of each one of the decoders DE5–DE8 are connected together and the fourth terminal 4 of each one of the decoders DE5–DE8 are connected together. The control circuit CTR which generates the potentials at the five terminals 1, 2, 3, 4, and 5, therefore has only one output connected to the third terminals 3 and has only one output connected to the fourth terminals 4 of the decoders DE1–DE4 of the decoder group DG1. Similarly, the control circuit CTR has only one output connected to the third terminals 3 and has only one output connected to the fourth terminals 4 of the decoders DE5–DE8 of the decoder group DG2 (the control circuit CTR of this exemplary embodiment will be discussed further below with regard to FIG. 7). On the other hand, the control circuit CTR has respectively separate outputs for driving the first terminals 1, second terminals 2 and fifth terminals 5 of each decoder DE1–DE4 within the decoder group DG1. The first terminal 1, the second terminal 2 and the fifth terminal 5 of a respective decoder DEi (where i=1–4) from the first decoder group DE1 are connected to the corresponding terminals of a respective decoder DEi+4 (where i=1–4) from the second decoder group DE2.

The control circuit CTR generates the control signals $RD_i$, and inverse $RD_i$, where i=0–1. The control circuit CTR also generates the control signals $DRV_i$, $RST_i$ and $NEG_i$, where i=0–3 as shown in FIG. 5. In FIG. 5, the potential of these control signals is illustrated for one operating state of the control circuit CTR. Also illustrated is the resultant output potential at the output terminals OUTi of the decoders DEi (i=1–8) in accordance with the table shown in FIG. 4. Referring to FIG. 5, it is possible to generate 4V at a first output OUT1, to generate –2V at a second output OUT2 and to generate 0V at all of the remaining outputs OUT3 to OUT8 in a simple manner as a function of the potentials generated by the control circuit CTR.

Figure 7:
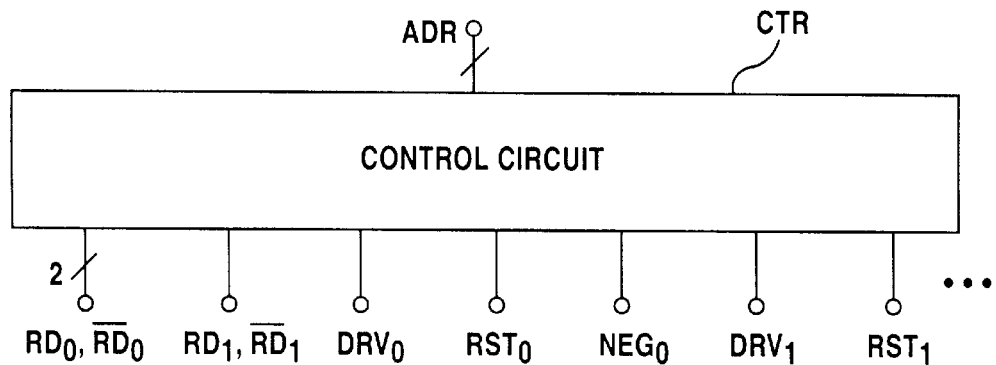
FIG. 7 shows an exemplary embodiment of a control circuit for driving the decoders shown in FIG. 5.

FIG. 7 shows the control circuit CTR which generates the control signals shown in FIG. 5. Similar to the control circuit shown in FIG. 3, the control signals are generated at its outputs by the pre-decoding of addresses present at its address inputs ADR.

Figure 6:
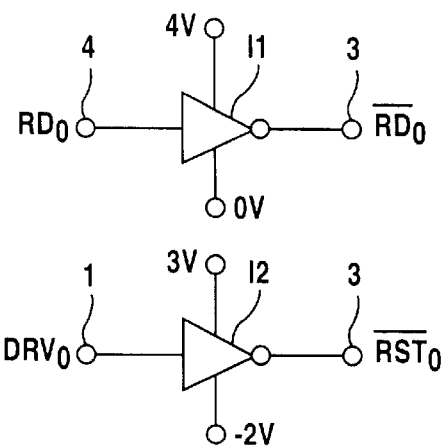
FIG. 6 shows two inverter that are part of the control circuit shown in FIG. 3 and that generate some of the signals illustrated in FIG. 5.

FIG. 6 shows a first inverter circuit I1 and a second inverter circuit I2, that are part of the control circuit CTR shown in FIG. 7. The first inverter circuit I1 generates the control signal inverse $RD_0$ at the third terminal 3 from the control signal $RD_0$ at the fourth terminal 4 of the decoders DE1 to DE4 of the first decoder group DG1. The first inverter circuit I1 has a level converter (not illustrated in any specific detail) which generates its output signal inverse $RD_0$ with a low level of 0V and a high level of 4V. The input signal $RD_0$ at the first inverter circuit I1, in accordance with the table in FIG. 4, at the fourth terminal 4 has a low level of –2V and a high level of 3V. The second inverter circuit I2 generates the control signal $RST_0$ from the control signal $DRV_0$. The second inverter circuit I2 also has a level converter which generates its output signal $RST_0$ with a low level of –2V and with a high level of 3V, even though its input signal $DRV_0$ at the first terminal 1, in accordance with the table in FIG. 4, has a low level of 0V and a high level of 4V.

The control circuit CTR shown in FIG. 7, for each decoder group DG1 and DG2 has a first inverter circuit I1 of the type shown in FIG. 6 and four second inverter circuits I2 of the type shown in FIG. 6. The first inverter circuits I1 generate, the two signals inverse $RD_i$ from the two input signals $RD_i$ (where i–0–1). Each one of the second inverter circuits I2 generates a respective one of the four output signals $RST_i$ from a respective one the four input signals $DRV_i$ (where i–=0–3)

In other exemplary embodiments, it is also possible for the input and output signals of the inverter circuits I1, I2 to be mutually interchanged relative to FIG. 6. Accordingly, the level converter has to be adapted in each case so as to enable continuing generation of the levels (which can be obtained from FIG. 4) of the control signals at the terminals 1 to 5.

The level conversion by the two inverter circuits I1, I2 shown in FIG. 6 enables the generation of the potentials illustrated in FIG. 4 at the terminals 1 to 5. Adhering to these potentials ensures that the gate oxide of the transistors T1 to T5 is not loaded to an excessively great extent, since the magnitude of their gate-source voltages and/or gate-drain voltages is limited.

Figure 8:
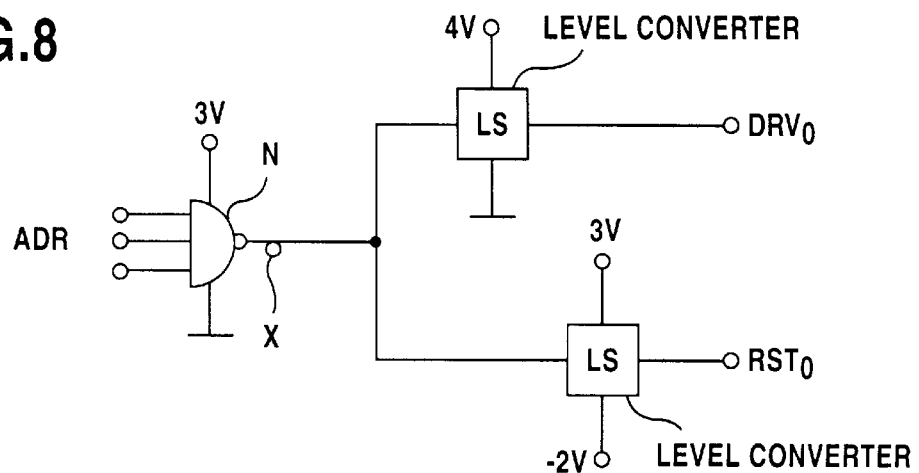
FIG. 8 shows an alternative realization of the inverters shown in FIG. 6.

FIG. 8 shows a portion of the control circuit CTR that includes an alternative variant to that of FIG. 6 for generating the control signals $DRV_0$, and $RST_0$. A NAND gate N is fed some of the address bits ADR, as a function of which it generates an intermediate signal X with the levels 0V and 3V. The intermediate signal X is fed to two level converters LS. One level converter LS generates the control signal $DRV_0$ that can have levels of 0V and 4V, from the intermediate signal X. The other level converter LS generates the control signal $RST_0$ that can have levels of –2V and 3V, from the intermediate signal X. A similar circuit may be provided for generating the control signals $RD_0$ and inverse $RD_0$.

We claim:

1. An integrated circuit, comprising:
   a decoder having an output terminal, a first terminal, a second terminal, a third terminal, a fourth terminal, and a fifth terminal;
   said decoder having three operating states including a first operating state for generating a first potential at said output terminal, a second operating state for generating a second potential at said output terminal, and a third operating state for generating a third potential at said output terminal; the second potential lying between the first potential and the third potential;
   said decoder including:
      a first transistor being of a first conductivity type, having a control terminal connected to said third terminal of said decoder and having a drain-to-source path;
      a second transistor being of a second conductivity type, having a control terminal connected to said fourth terminal of said decoder and having a drain-to-source path;
      a third transistor being of the second conductivity type, having a control terminal connected to said fifth terminal of said decoder;
      a fourth transistor having a control terminal connected to said fourth terminal of said decoder and having a drain-to-source path for connecting said output terminal of said decoder to the second potential; and
      a series circuit connected between said first terminal of said decoder and said second terminal of said decoder, said series circuit including said first transistor, said second transistor, said third transistor, and a node connected to said output terminal of said decoder and between said first transistor and said second transistor.

2. The integrated circuit according to claim 1, wherein said decoder includes a fifth transistor of the second conductivity type, having a control terminal connected to a fixed potential that lies between the second potential and the third potential, and having a drain-to-source path for connecting said output terminal of said decoder to said drain-to-source path of said fourth transistor.

3. The integrated circuit according to claim 1, comprising:
   five terminals defined by said first terminal, said second terminal, said third terminal, said fourth terminal, and said fifth terminal of said decoder; and a control circuit connected to said five terminals and having a plurality of operating states in which it generates potentials at said five terminals;

said decoder generating an output potential, at said output terminal, selected from the group consisting of the first potential, the second potential, and the third potential as a function of the potentials at said five terminals.

4. The integrated circuit according to claim 3, wherein:

said plurality of operating states of said control circuit includes a first operating state causing said decoder to generate the first potential at said output terminal; and in the first operating state of said control circuit, said control circuit generates the second potential at said first terminal and at said third terminal of said decoder, said control circuit generates the first potential at said second terminal of the decoder, and said control circuit generates a fourth potential at said fourth terminal and at said fifth terminal of said decoder, the fourth potential lying between the second potential and the third potential.

5. The integrated circuit according to claim 3, wherein:

the plurality of operating states of said control circuit includes a second operating state causing said decoder to generate the second potential at said output terminal; and in the second operating state of said control circuit, said control circuit generates the second potential at said first terminal, at said second terminal, and at said third terminal of said decoder, and said control circuit generates a fourth potential at said fourth terminal and at said fifth terminal of said decoder, the fourth potential lying between the second potential and the third potential.

6. The integrated circuit according to claim 3, wherein:

the plurality of operating states of said control circuit includes a third operating state causing said decoder to generate the second potential at said output terminal; and in the third operating state of said control circuit, said control circuit generates a potential selected from the group consisting of the second potential and the third potential at said first terminal of said decoder, and said control circuit generates a potential selected from the group consisting of the first potential and the second potential at said second terminal of said decoder, said control circuit generates the third potential at said third terminal of said decoder, said control circuit generates the first potential at said fourth terminal of said decoder, and said control circuit generates a potential selected from the group consisting of the first potential and a fourth potential at said fifth terminal of said decoder, the fourth potential lying between the second potential and the third potential.

7. The integrated circuit according to claim 3, wherein:

said plurality of operating states of said control circuit includes a fourth operating state causing said decoder to generate the third potential at said output terminal; and in the fourth operating state of said control circuit, said control circuit generates the third potential at said first terminal of said decoder, said control circuit generates the second potential at said second terminal and at said third terminal of said decoder, said control circuit generates the first potential at said fifth terminal of said decoder, and said control circuit generates a fourth potential at said fourth terminal of said decoder, the fourth potential lying between the second potential and the third potential.

8. The integrated circuit according to claim 3, wherein said control circuit includes an inverter connected between said third terminal and said fourth terminal of said decoder.

9. The integrated circuit according to claim 3, wherein said control circuit includes an inverter connected between said first terminal and said fifth terminal of said decoder.

10. The integrated circuit according to claim 1, comprising:

a first decoder defined by said decoder;

a second decoder having the same construction as said first decoder, whereby said second decoder has a third terminal and a fourth terminal; and a decoder group defined by said first decoder and said second decoder, said third terminal of said first decoder connected to said third terminal of said second decoder, and said fourth terminal of said first decoder connected to said fourth terminal of said second decoder.

11. The integrated circuit according to claim 10, comprising:

a first decoder group defined by said decoder group; and a second decoder group having the same construction as said first decoder group, whereby said second decoder group includes a first decoder having a first terminal, a second terminal, and a fifth terminal, and a second decoder having a first terminal, a second terminal, and a fifth terminal;

said first terminal of said first decoder of said first decoder group connected to said first terminal of said first decoder of said second decoder group;

said second terminal of said first decoder of said first decoder group connected to said second terminal of said first decoder of said second decoder group; and said fifth terminal of said first decoder of said first decoder group connected to said fifth terminal of said first decoder of said second decoder group.

* * * * *